United States Patent
Baumgartner et al.

(10) Patent No.: US 7,930,672 B2
(45) Date of Patent: *Apr. 19, 2011

(54) INCREMENTAL DESIGN REDUCTION VIA ITERATIVE OVERAPPROXIMATION AND RE-ENCODING STRATEGIES

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 555 days.

This patent is subject to a terminal disclaimer.

(21) Appl. No.: 12/027,085

(22) Filed: Feb. 6, 2008

(65) Prior Publication Data

US 2008/0127002 A1    May 29, 2008

Related U.S. Application Data

(63) Continuation of application No. 11/011,246, filed on Dec. 14, 2004, now Pat. No. 7,370,292.

(51) Int. Cl.
    G06F 17/50    (2006.01)
(52) U.S. Cl. .................. 716/132; 716/106; 716/107
(58) Field of Classification Search .............. 716/2–7, 716/106, 107, 132
    See application file for complete search history.

(56) References Cited

U.S. PATENT DOCUMENTS

| | | | |
|---|---|---|---|
| 6,026,220 A | 2/2000 | Cleereman et al. | |
| 6,141,633 A | 10/2000 | Iwashita et al. | |
| 6,192,505 B1 | 2/2001 | Beer et al. | |
| 6,425,110 B1 | 7/2002 | Hathaway et al. | |
| 6,557,145 B2 | 4/2003 | Boyle et al. | |
| 6,848,088 B1 | 1/2005 | Levitt et al. | |
| 6,944,838 B2 | 9/2005 | McMillan | |
| 7,047,139 B2 | 5/2006 | Shtrichman | |
| 7,111,268 B1 | 9/2006 | Anderson et al. | |
| 7,146,589 B1 * | 12/2006 | Rampon et al. | 716/5 |
| 7,370,292 B2 | 5/2008 | Baumgartner et al. | |
| 2003/0208730 A1 | 11/2003 | Singhal et al. | |
| 2004/0093571 A1 | 5/2004 | Jain et al. | |
| 2006/0129959 A1 | 6/2006 | Mang et al. | |

* cited by examiner

*Primary Examiner* — Vuthe Siek
(74) *Attorney, Agent, or Firm* — Dillon & Yudell LLP

(57) ABSTRACT

A method of incrementally reducing a design is disclosed. A logic verification tool receives a design and a property for verification with respect to the design, and then selects one or more of a plurality of diverse techniques for reducing the design. The logic verification tool then reduces the design to create a reduced design using the one or more techniques and attempts to generate a valid solution for the property on the reduced design. The logic verification tool determines whether a valid solution is generated, and, if not, replaces the design with the reduced design. Until a valid solution is generated, the logic verification tool iteratively performs the selecting, reducing, determining and replacing steps.

19 Claims, 2 Drawing Sheets

US 7,930,672 B2

INCREMENTAL DESIGN REDUCTION VIA ITERATIVE OVERAPPROXIMATION AND RE-ENCODING STRATEGIES

PRIORITY CLAIM AND CROSS-REFERENCE TO RELATED APPLICATIONS

The present application is a continuation of U.S. patent application Ser. No. 11/011,246, filed on Dec. 14, 2004, now U.S. Pat. No. 7,370,292 and entitled, "Method for Incremental Design Reduction Via Iterative Overapproximation and Re-Encoding Strategies, which also is related to U.S. Pat. No. 7,322,017 entitled "Method for Verification Using Reachability Approximation," which are assigned to the assignee of the present invention and incorporated herein by reference.

BACKGROUND OF THE INVENTION

1. Technical Field

The present invention relates in general to testing and verification, and in particular to verification of digital designs. Still more particularly, the present invention relates to a system, method and computer program product for incremental reduction of a digital design through iterative overapproximation and re-encoding.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification. Functional hardware verification has been a traditional method for verifying such complex designs as processor chips. Because the functional hardware verification time for a design grows in relation to the number of logic elements, functional hardware verification of complex systems is one of the most time-consuming computing tasks today. It is therefore important to use functional hardware verification cycles effectively, with the aim that few bugs escape and development time is reduced.

As mentioned above, functional hardware verification is a computationally expensive process; for sequential designs, functional hardware verification is a PSPACE-complete problem (by algorithmic complexity analysis) and hence generally requires resources which are exponential with respect to the size of the design under verification. Many prior art functional hardware verification proof algorithms rely upon reachability analysis, which requires enumerating the reachable states of the design under test to assess whether the design conforms to its specification, which unfortunately is a size-limited process.

Reachability analysis is a powerful verification framework; it is able to identify whether a design satisfies its specification (i.e., if all reachable states of a design satisfy the property being verified, then a correctness proof has been completed) and also whether the design does not satisfy its specification (if any of the reachable states does not satisfy the property being verified). Reachability algorithms operate by assigning R_0 to be the set of predefined initial states of the design under verification, then assigning R_{i+1} (for increasing i) to be the set of all states which may be reached in one design transition from R_i. Eventually, R_{i+1} will be a subset of all the previous states encountered in R_0 . . . R_i, after which this process will terminate; this final set of reachable states is referred to as R. To partially alleviate some of the computational overhead of the expensive process of computing the exact set of reachable states, there have been numerous proposals to "overapproximate" the set of reachable states. For example, some authors have proposed using "inductive" methods. The drawback of prior art overapproximation methods is that they are often inconclusive, resulting in "spurious failures" due to their overapproximate nature.

Despite decades of research in improving the performance of reachability analysis, such techniques are still limited in application to designs with several hundreds of state elements or less and are also hindered by other design size metrics. Because of the size limitations of reachability analysis, there has been some research in ways to overapproximate the reachable state set to enable computational shortcuts. For example, inductive proofs begin with R_0 being all states which do not themselves violate a property (after guaranteeing that the actual initial states of the design are a subset of this overapproximated R_0), and compute an overapproximated set R' starting from this overapproximated initial state set. The benefits of this approach include a substantial decrease in the number of steps needed to complete the analysis. The main drawback of this inductive approach is that it often renders an inconclusive result. In particular, if the overapproximated set R' contains some states S' which violate the property being verified, one cannot immediately discern if this violation is only due to the overapproximation of the initial state set (i.e., S' is a subset of R'-R), or if S' contains some truly reachable states in R. The former case is a spurious failure of the property being verified.

Cut-point insertion refers to the process of replacing a gate in the netlist with a random gate. A design modified by cut-point insertion is called overapproximated because it may "simulate" the original design—the random gate may exhibit any behavior that the gate it is replacing may exhibit, but the converse is not necessarily true. Such an overapproximate technique increases the number of random gates in the design, sometimes dramatically; certain algorithms (particularly those based upon Binary Decision Diagrams) may suffer computational bottlenecks due to this increase in random gates.

Many prior art techniques exist for re-encoding a design to obtain a functionally-equivalent reduction of a design. Given a combinationally-driven cut of the design under test (i.e., the 'source' side of the cut contains no state elements), a re-encoding tool can compute the set of values that are producible at those cut gates. More generally, given a cut of the design under test which contains zero or more state elements and zero or more random gates, the re-encoding tool can compute the set of values that are producible at those cut gates as a function of values of the state elements. The re-encoding tool can then create a new piece of logic which produces exactly the same behavior as the 'source' side of the cut as a function of the state elements, and replace the cut gates with this new logic. Note that one cannot merely inject cutpoints to the cut gates, as that would generally constitute an overapproximate transformation, whereas the purpose of re-encoding is to render a property-preserving transformation.

It is often the case that the ability of the re-encoding tool to create a significantly simpler piece of logic than that being replaced relies upon the 'source' side of the cut containing a significant number of random gates in its 'combinational fanin cone'—i.e., the set of gates which may be reached by fanin traversal without traversing through a register. Because re-encoding relies on selecting cutpoints for which the 'source' side of the cut contains random gates, conventional methods for re-encoding suffer from paralyzing limitations in terms of the depth of the design to which cutpoints can be injected. In other words, re-encoding is often of no utility for logic deep from the random gates, e.g., that which is exclusively driven by state elements. This depth limitation has conventionally limited the usefulness of re-encoding techniques.

The limitations of conventional systems of re-encoding and prior art systems for overapproximation are well documented. What is needed is a more efficient method for verifying digital designs utilizing a method that obviates the known limitations of overapproximation and the depth limitation of re-encoding.

SUMMARY OF THE INVENTION

A method of incrementally reducing a design is disclosed. A logic verification tool receives a design and a property for verification with respect to the design, and then selects one or more of a plurality of diverse techniques for reducing the design. The logic verification tool then reduces the design to create a reduced design using the one or more techniques and attempts to generate a valid solution for the property on the reduced design. The logic verification tool determines whether a valid solution is generated, and, if not, replaces the design with the reduced design. Until a valid solution is generated, the logic verification tool iteratively performs the selecting, reducing, determining and replacing steps.

In the present invention, the particular synergy between employed overapproximation method and the employed re-encoding method results in several benefits. The structural overapproximation technique employed by the present invention turns sequentially-driven logic into combinationally-driven logic, and more generally injects random gates deeper into the cone of the design. This helps the re-encoding technique of the present invention, because the latter is primarily adept at reducing logic near random gates and is the weakest at eliminating purely sequential logic.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention provides a novel synergistic transformation technique for reducing verification complexity. In particular, the present invention facilitates the synergistic use of a structural overapproximation technique for reducing the size of a sequential design, coupled with the use of a re-encoding technique to render additional property-preserving reductions. The benefit of this synergistic approach is that it enables design reductions far exceeding those possible in the prior art. The result of the present invention is drastic savings in computational resources for the verification process, enabling design flaws to be exposed and proofs to be completed that otherwise would be unfeasible.

The present invention relies upon the synergistic application of two techniques to yield increasing reductions of the design under test. First, a logic re-encoding technique simplifies the design under test while preserving its behavior. This re-encoding technique computes the set of values producible at a cut of the design under test as a function of its state elements, then re-encodes the cut by creating logic that produces exactly the same set of values as a function of its state elements. Because the re-encoding technique is designed with the freedom to create a completely new, yet behaviorally identical (with respect to the cut gates) piece of logic, this technique often offers a superset of the reductions possible using redundant-gate elimination techniques. This technique does not explicitly seek to reduce sequential logic of a design; it instead attempts to reduce the amount of combinational logic (and random gates) in the cut, and to simplify the dependence/correlation of the fan-out side of the cut with the state elements in the fan-in side of the cut.

Second, a structural overapproximation technique is employed as a way to simplify the design under test while possibly adding randomness to its behavior. Such a technique is described in detail in the cross-referenced application described above, which is incorporated by reference in its entirety. This technique often seeks to explicitly eliminate sequential logic from the design by injecting cut-points (formed from random gates) in place of other gates in the design.

Figure 1:
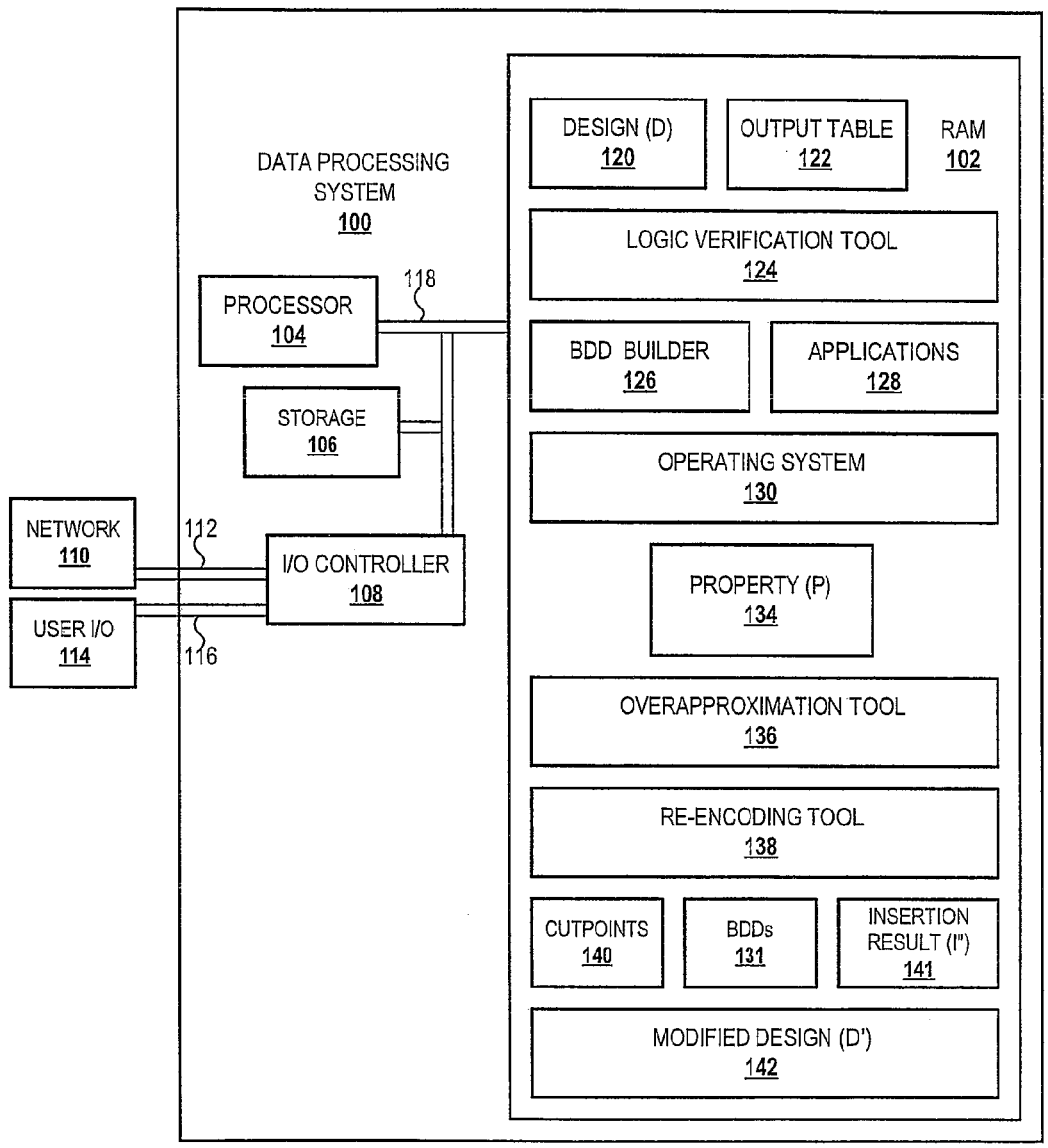
FIG. 1 depicts a block diagram of a data processing system equipped with a computer program product for incremental reduction of a digital design through iterative overapproximation and re-encoding, in accordance with a preferred embodiment of the present invention.

With reference now to the figures, and in particular with reference to FIG. 1, a simplified block diagram of a data processing system equipped with a computer program product for incremental reduction of a digital design through iterative overapproximation and re-encoding, in accordance with a preferred embodiment of the present invention, is depicted. A data processing system 100 contains a processing storage unit (e.g., RAM 102) and a processor 104. Data processing system 100 also includes non-volatile storage 106 such as a hard disk drive or other direct access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions, while operating in accordance with a preferred embodiment of the present invention. These items include a design (D) 120 and an output table 122 for interaction with a logic verification tool 124, and a binary decision diagram (BDD) builder 126. Other applications 128 and logic verification tool 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention.

Processor 104 executes instructions from programs, often stored in RAM 102, in the course of performing the present invention. In a preferred embodiment of the present invention, processor 104 executes logic verification tool 124. Logic verification tool 124 incrementally reduces a digital design contained in design (D) 120 to create modified design (D') 142 through iterative overapproximation and re-encoding in conjunction with the operation of binary decision diagram builder 126, re-encoding tool 138 and overapproximation tool 136. Logic verification tool additionally verifies a property (P) 134 on design (D) 120. Generally speaking, logic verification tool 124 contains rule-based instructions for predicting the behavior of logically modeled items of hardware. Binary decision diagram builder 126 converts the structural representation in design (D) 120 into a functionally canonical form in BDDs 131. Logic verification tool 124 then operates on the series of rules contained in its own instructions, in conjunction with design (D) 120, and associated binary decision diagrams (BDDs) 131.

Design (D) 120 may model the designs of many different kinds of logical hardware, such as microprocessors and application specific integrated circuits (ASICs). Design (D) 120 is represented structurally as a netlist, comprising a directed graph where each node is a gate of some type, e.g. an AND gate, an inverter, a primary input (or random gate), or a state element. BDD builder 126 transforms design (D) 120 into BDDs 131 for use with logic verification tool 124 and, where appropriate, re-encoding tool 138 and overapproximation tool 136. The netlist of design (D) 120 is defined in terms of semantic traces, which map the gates to 0, 1 values in BDDs 131 over time. Each state element in design (D) 120 is associated with a next-state function (defining what value it will take one time-step in the future), as well as an initial value (defining what value it will take at time 0), each of which are represented as a gate. Design (D) 120 is represented as a directed graph with nodes representing gates of various functionality (e.g., primary inputs hitherto referred to as random gates, combinational functions such as AND gates and inverters, and state elements), and edges representing interconnections between those gates. Interconnections are directed, routing data from "source" to "sink".

Additional items of data stored in RAM 102 include property (P) 134, cutpoints 140, and modified design (D') 142. Property (P) 134 contains the behavior to be verified on design (D) 120. Cutpoints 140 contains a group of random gate insertion instructions for insertion into modified design (D') 142, which contains the most current result of the present invention as applied to design (D) 120.

Cutpoints 140 represent partitions of the netlist of design (D) 120 into two graphs, where the only directed path from gates in the "source" graph to the "sink" graph flow through the gates comprising the cut. "Injecting a cutpoint" refers to the process of replacing a gate in the netlist with a random gate. A random gate is evaluated as an unconstrained source of random bit-streams in the verification process.

Logic verification tool 124 records results to output table 122. Logic verification tool 124 may also report the contents of output table 122 or selected indicators of the status of design (D) 120 to user I/O 114 or applications 128. Additionally, all or part of logic verification tool 124, operating system 130, design (D) 120, output table 122, re-encoding tool 138 and overapproximation tool 136 may, at times, be stored in storage 106. Additional data structures, which are well known in the art, are used by re-encoding tool 138 and overapproximation tool 136 and are not shown for the sake of illustrative simplicity.

In the method of the present invention, logic verification tool 124 relies upon exploiting cutpoint insertion by overapproximation tool 136 to eliminate (possibly sequential) logic, then uses a re-encoding method supplied by re-encoding tool 138 and overapproximation tool 136 to reduce the size of the overapproximated design (D) 120, resulting in modified design (D') 142. Logic verification tool 124 then re-applies overapproximation tool 136 to eliminate (possibly sequential) logic, followed by a re-encoding method supplied by re-encoding tool 138 and overapproximation tool 136 to reduce the size modified design (D') 142, to yield incrementally greater reductions. The overapproximation by overapproximation tool 136 synergistically enables greater reductions by re-encoding tool 138. Similarly, the re-encoding by re-encoding tool 138 synergistically enables a greater potential of reductions through the heuristic overapproximation of overapproximation tool 136 by making the "minimal set" of gates necessary to preserve the functional behavior of design (D) 120 easier to identify (due to reduced correlation between sequential elements). The present invention is more robust than the prior art against arbitrarily-selected cutpoint injections causing spurious counterexamples. Additionally, the re-encoding by re-encoding tool 138 is useful to offset the increase in the number of random gates of the overapproximated design created by overapproximation tool 136.

One particularly helpful effect of the present invention is that the present invention effectively enables a re-encoding by re-encoding tool 138 of "sequential" logic deep in design (D) 120 solely by leveraging "combinational" algorithms. The overapproximation by overapproximation tool 136 will safely translate certain sequential logic to combinational logic, against which re-encoding by re-encoding tool 138 is particularly effective. This combination, in turn enables "deep" reductions by re-encoding tool 138 to design (D) 120, ultimately enabling a conclusive verification result with respect to property (P) 134, even for large and complex problems that otherwise would remain unsolved given prior art techniques. While the technique of the present invention is applicable to rendering sequential reductions of design (D) 120, one may also apply the method of the present invention to yield reductions to combinational designs.

Figure 2:
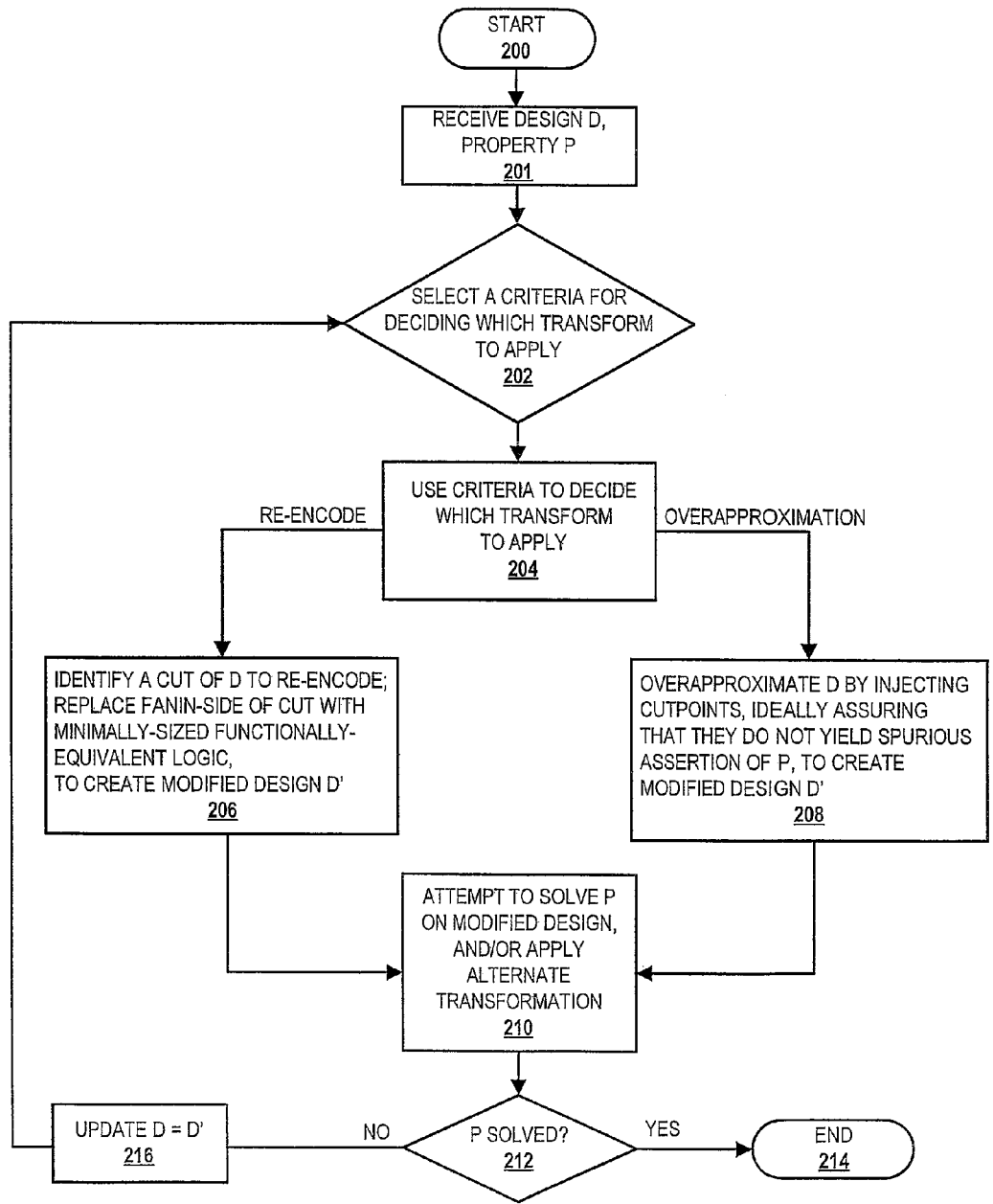
FIG. 2 is a high-level logical flowchart of a process for incremental reduction of a digital design through iterative overapproximation and re-encoding, in accordance with a preferred embodiment of the present invention.

Broadly, as will be illustrated with respect to FIG. 2, this overall process of the present invention may be described as a few steps. First, logic verification tool 124 imports design (D) 120, and property (P) 134, a property to verify with respect to that design. Second, the overapproximation step is performed in several substeps. Logic verification tool 124 uses BDD builder 126 to generate BDDs 131. Logic verification tool 124 computes a set of candidate gates for cutpoint insertion, and saves these as cutpoints 140. Overapproximation tool 136 then overapproximates design (D) 120 by inserting cutpoints (random gates) to those candidate gates to eliminate large portions of design (D) 120, which may include elimination of sequential logic. In one embodiment, the cut-point 140 selection process may be performed using any variety of analysis algorithm (e.g., localization refinement, which is discussed briefly below) to ensure that the overapproximation entailed by the cutpoint 140 insertion in design (D) 120 does not yield spurious failures of design (D) 120.

Third, logic verification tool 124 computes a cut of the netlist graph and saves it as cutpoints 140. Logic verification tool 124 then uses re-encoding tool 138 to apply a re-encoding of design (D) 120 at cutpoints 140 to attempt to eliminate logic from the design. The purpose of this third step is to reduce the size design (D) 120 (particularly in terms of combinational gates and random gates) while preserving its behavior. The reduced design is then saved as modified design (D') 142. As will be discussed below, the second and third steps of the method of the present invention may be performed in a different order, based on selection criteria discussed with respect to FIG. 2.

Fourth, logic verification tool 124 attempts a verification effort with respect to property (P) 120 on modified design (D') 142 using any algorithms available. If the verification problem remains unsolved, logic verification tool 124 returns to the second step for additional reductions.

Turning now to FIG. 2, a high-level logical flowchart of a process for incremental design reduction via iterative overapproximation and re-encoding is depicted. The process starts at step 200. The process next moves to step 201, which depicts logic verification tool 124 receiving design (D) 120 and property (P) 134. The process then proceeds to step 202. Step 202 illustrates logic verification tool 124 selecting criteria for deciding which of the available transformation methods to apply to design 120. Examples of such criteria available to logic verification tool 124 include selecting the alternate of the last performed transformation. Examples of available criteria also include iterating between transformation types, which would, in one embodiment include iteratively increasing the resources used in each transformation type. If design (D) 120 has inputs beyond a threshold number, logic verification tool 124 could automatically choose re-encoding. Similarly, if design (D) 120 has many state elements, or the property (P) 134 for verification is sequentially deep from the inputs, cutpoint 140 insertion could automatically be performed to generate an overapproximation.

The process next passes to step 204, which depicts logic verification tool 124 applying the criteria selected in step 202 to decide which transform to apply. While the method of the present invention as depicted with respect to FIG. 2 reflects the serial use of methods of transformation, one skilled in the art will quickly ascertain that the transformation methods available in the preferred embodiment may also be performed in parallel, with comparison of computing results. If logic verification tool 124 chooses to re-encode design (D) 120, then the process moves to step 206. At step 206, logic verification tool 124 employs re-encoding tool 138 to identify a cut of design (D) 120 to re-encode, replacing the fan-in side of each cut with minimally sized functionally equivalent logic to create modified design (D') 142. The re-encoding technique synergistically enhances the ability of the overapproximation technique to eliminate sequential logic by reducing the correlation of state variables in design (D) 120, facilitating the ability of heuristic algorithms in overapproximation tool 136 to identify a smaller "minimal set" of adequate gates to preserve. Stated differently, by eliminating some connections between sequential elements, re-encoding tool 138 increases the probability that injecting a cutpoint from among cutpoints 140 to an arbitrarily-selected gate will still result in an over-approximated modified design (D') 142, which satisfies its specification. Without such a re-encoding tool 138, there is a greater chance that an arbitrarily-chosen cutpoint injection from among cutpoints 140 will yield a spurious counterexample.

Re-encoding tool 138 attempts to render reductions as follows. Given a cut within cutpoints 140 of the design (D) 120, re-encoding tool 138 computes the set of values that are producible at those cut gates as a function of state elements in that cut. Re-encoding tool 138 then creates new logic that produces exactly the same behavior as the 'source' side of the cut within cutpoints 140 as a function of the state elements, and replaces the cut gates with this new logic. Note that one cannot merely inject cutpoints to the cut gates, as that would generally constitute an overapproximate transformation, whereas the purpose of this transformation by re-encoding tool 138 in the present invention is to render a property-preserving transformation. More specifically, a set of N cutpoints 140 can produce any possible stream of $2^N$ values over time, whereas the behavior of the original cut gates may be constrained to only produce a subset of the possible values.

The advantage of this use of re-encoding tool 138 to produce a reduction is the creation of a simpler yet functionally equivalent replacement logic, reducing the overall size of modified design (D') 142 with respect to design (D) 120. Note also that this approach is primarily geared towards reducing combinational logic and random gates, as it directly reuses the state variables when re-encoding over sequential cuts. After step 206, the process then proceeds to step 210, which is explained following the discussion of step 208.

Returning to step 204, if logic verification tool 124 determines to transform design (D) 120 by overapproximation, then the process moves to step 208. At step 208, logic verification tool 124 employs overapproximation tool 136 to over-approximate design (D) 120 by injecting cutpoints, ideally assuring that they do not yield spurious assertions of property (P) 134 to create modified design (D') 142. Practically, structural overapproximation algorithms employed in overapproximation tool 136 are often heuristic, attempting to discern a minimal set of gates (particularly state elements) of design (D) 120, which are needed to ensure that a property under verification will pass and to inject cut-points to the other gates. An "overapproximate transformation" is one which may add randomness to the behavior of design (D) 120. For example, if one injects a set of cutpoints 140 into a design, the result is generally overapproximate because cutpoints 140 behave as completely random sources, and hence can 'simulate' any possible behavior of the original gates being replaced. But those original gates cannot necessarily produce some of the behavior that the random gates can produce. A spurious failure refers to the condition where an overapproximation of design (D) 120 causes a failure that would not be possible without the overapproximation.

As used in overapproximation tool 136, a structural overapproximation technique operates by injection of cutpoints 140. In one embodiment, overapproximation tool 136 eliminates significant portions of design (D) 120 by effectively isolating a cut of design (D) 120 and injecting cutpoints 140 (i.e., random gates) to those cut gates, the source side of which then drops out of the cone of influence. This method may be deployed in a manner which explicitly seeks to eliminate sequential logic in design (D) 120. In one embodiment, this cutpoint selection process uses some form of analysis of design (D) 120 to ensure that the cutpoints 140 being inserted, which overapproximate the behavior of the design under test, do not render spurious failures. One embodiment will employ a scheme termed 'localization refinement'. Such a localization refinement includes injecting cutpoints 140, running some (possibly underapproximate) verification to attempt to assess whether the cutpoints 140 cause spurious failures, then if so to "refine" the cutpoints 140 by eliminating them and possibly re-inserting them further back in the fan-in cone of the earlier cutpoints 140 to attempt to eliminate the corresponding spurious failure. Nevertheless, the particular method used to determine where to inject cutpoints 140 will vary among many possible embodiments.

From either of step 206 or step 208 the process then moves to step 210, which depicts logic verification tool attempting to solve property (P) 134 on modified design (D') 142 and/or apply an alternate transformation. The process then moves to step 212, which illustrates logic verification tool 124 determining whether property (P) 134 has been solved with respect to modified design (D') 142. If property (P) has been solved with respect to modified design (D') 142, then the process ends at step 214. If at step 212, property (P) has not been solved with respect to modified design (D') 142, then the process proceeds to step 216, which depicts logic verification tool substituting the content of modified design (D') 120 for design (D) 120. The process then returns to step 202, which is described above.

By leveraging the above discussed overapproximation tool 136 and re-encoding tool 138 in a synergistic fashion, the present invention enables significantly greater design reductions than possible with the prior art, resulting in greater bug-hunting power in addition to proof capability. The particular synergy between overapproximation tool 136 and re-encoding tool 138 results in several benefits. The structural overapproximation technique employed by overapproximation tool 136 turns sequentially-driven logic into combinationally-driven logic, and more generally injects random gates deeper into the cone of the design (D) 120. This helps the re-encoding technique of re-encoding tool 138, because the latter is primarily adept at reducing logic near random gates and is the weakest at eliminating purely sequential logic.

Moreover, the re-encoding technique of re-encoding tool 138 reduces correlation between state variables in the fanin-side of the cut and the fanout-side of the cut. In some cases, certain state variables may be outright eliminated from the problem by the re-encoding (e.g., if a gate on the cut is an XOR of a primary input and a state element, that XOR gate may take any value at any point in time regardless of the value of the state element, and the re-encoding may be able to replace the XOR gate safely by a cut-point). More generally, the reduction minimizes the number of connections between state elements in the fanin-side of the cut and the fanout-side of the cut.

One particularly useful advantage of the present invention is that it effectively enables a re-encoding by re-encoding tool 138 of "sequential" logic deep in the design solely by leveraging "combinational" algorithms. The prior art sequential re-encoding is generally a PSPACE-complete problem, whereas the latter combinational analysis of the present invention is only a simpler NP-complete problem.

While in the described embodiment, this invention is to be applied to simplify sequential designs, these techniques may equally well be applied to combinational designs. Overall, the combined method of the present invention is more robust against arbitrarily-selected cutpoint injections causing spurious counterexamples. Additionally, the re-encoding by re-encoding tool 138 is useful to offset the increase in the number of random gates of the overapproximated design produced by overapproximation tool 136.

While the present invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A system for incrementally reducing a circuit design, said system comprising:
    means, responsive to receiving a circuit design and a property for logical verification with respect to said circuit design, for reducing said circuit design to create a reduced circuit design, said means for reducing includes means for re-encoding a portion of said circuit design by replacing the fan-in side of a cut with equivalent logic of reduced size and means for overapproximating said circuit design by injecting cutpoints in parallel;
    means for determining whether a valid solution for said property on said reduced circuit design can be generated, wherein said valid solution is a valid result of combinational logic irrespective of any physical layout of said circuit design;
    means for replacing said circuit design with said reduced circuit design;
    means, until said valid solution can be generated, for repeating said reducing, determining and replacing; and
    means, responsive to generating said valid solution, outputting said valid solution from said data processing system.

2. The system of claim 1, wherein said means for re-encoding further comprises means for re-encoding the portion of said circuit design by replacing the fan-in side of the cut with equivalent logic of reduced size if said circuit design has many inputs.

3. The system of claim 1, wherein said means for overapproximating said circuit design further comprises means for overapproximating said circuit design by injecting cutpoints in parallel if said circuit design has many state elements.

4. The system of claim 1, and further comprising means for receiving a structural representation of said circuit design.

5. The system of claim 1, wherein said means for reducing said circuit design further comprises means for alternating between a plurality of diverse re-encoding or approximation techniques.

6. The system of claim 1, wherein said means for, until said valid solution is generated, repeating said reducing, determining and replacing, further comprises means for increasing a resource level allocated to said reducing, determining and replacing.

7. A computer program product comprising:
    a non-transitory computer-readable storage medium; and
    instructions on the computer-readable storage medium for incrementally reducing a circuit design in a data processing system, wherein the instructions, when executed by a data processing system, cause the data processing system to perform:
        in response to receiving a circuit design and a property for logical verification with respect to said circuit design, reducing said circuit design to create a reduced circuit design, wherein the reducing includes re-encoding a portion of said circuit design by replacing the fan-in side of a cut with equivalent logic of reduced size and overapproximating said circuit design by injecting cutpoints in parallel;

determining whether a valid solution for the property on the reduced circuit design can be generated, wherein said valid solution is a valid result of combinational logic irrespective of any physical layout of said circuit design;

replacing said circuit design with said reduced circuit design;

until said valid solution can be generated, repeating said reducing, determining and replacing; and in response to generating said valid solution, outputting said valid solution from said data processing system.

8. The computer program product of claim 7, wherein said re-encoding comprises re-encoding the portion of said circuit design by replacing the fan-in side of the cut with equivalent logic of reduced size if said circuit design has many inputs.

9. The computer program product of claim 7, wherein said overapproximating further comprises overapproximating said circuit design by injecting cutpoints in parallel if said circuit design has many state elements.

10. The computer program product of claim 7, wherein said instructions further cause the data processing system to perform receiving a structural representation of said circuit design.

11. The computer program product of claim 7, wherein said reducing said circuit design further comprises alternating between a plurality of diverse re-encoding or approximation techniques.

12. The computer program product of claim 7, wherein said repeating further comprises increasing a resource level allocated to said reducing, determining and replacing steps.

13. A data processing system, comprising:
a processor;
data storage coupled to the processor; and
instructions stored in the data storage and executable by the processor, wherein the instructions, when executed the processor, cause the data processing system to perform:
in response to receiving a circuit design and a property for logical verification with respect to said circuit design, reducing said circuit design to create a reduced circuit design, wherein said reducing includes re-encoding a portion of said circuit design by replacing the fan-in side of a cut with equivalent logic of reduced size and overapproximating said circuit design by injecting cutpoints in parallel;
determining whether a valid solution for the property on the reduced circuit design can be generated, wherein said valid solution is a valid result of combinational logic irrespective of any physical layout of said circuit design;
replacing said circuit design with said reduced circuit design;
until said valid solution can be generated, repeating said reducing, determining and replacing; and
in response to generating said valid solution, outputting said valid solution from said data processing system.

14. The data processing system of claim 13, wherein said re-encoding comprises re-encoding the portion of said circuit design by replacing the fan-in side of the cut with equivalent logic of reduced size if said circuit design has many inputs.

15. The data processing system of claim 13, wherein said overapproximating further comprises overapproximating said circuit design by injecting cutpoints in parallel if said circuit design has many state elements.

16. The data processing system of claim 13, wherein said instructions further cause the data processing system to perform receiving a structural representation of said circuit design.

17. The data processing system of claim 13, wherein said reducing said circuit design further comprises alternating between a plurality of diverse re-encoding or approximation techniques.

18. The data processing system of claim 13, wherein said repeating further comprises increasing a resource level allocated to said reducing, determining and replacing steps.

19. A method of data processing, comprising:
in response to receiving a circuit design and a property for logical verification with respect to said circuit design, a data processing system reducing said circuit design to create a reduced circuit design, wherein said reducing includes re-encoding a portion of said circuit design by replacing the fan-in side of a cut with equivalent logic of reduced size and overapproximating said circuit design by injecting cutpoints in parallel;
the data processing system determining whether a valid solution for the property on the reduced circuit design can be generated, wherein said valid solution is a valid result of combinational logic irrespective of any physical layout of said circuit design;
the data processing system replacing said circuit design with said reduced circuit design;
until said valid solution can be generated, repeating said reducing, determining and replacing; and
in response to generating said valid solution, outputting said valid solution from the data processing system.

* * * * *